(12) United States Patent
Ren

(10) Patent No.: US 10,400,942 B2
(45) Date of Patent: Sep. 3, 2019

(54) ELECTRONIC DEVICE, METHOD, AND APPARATUS FOR A DEFORMABLE SUPPORT STRUCTURE

(71) Applicant: Lenovo (Beijing) Limited, Beijing (CN)

(72) Inventor: Chun Ren, Beijing (CN)

(73) Assignee: Lenovo (Beijing) Limited, Beijing (CN)

(*) Notice: Subject to any disclaimer, the term of this patent is extended or adjusted under 35 U.S.C. 154(b) by 0 days.

(21) Appl. No.: 15/419,208

(22) Filed: Jan. 30, 2017

(65) Prior Publication Data

US 2017/0234478 A1    Aug. 17, 2017

(30) Foreign Application Priority Data

Jan. 29, 2016   (CN) .......................... 2016 1 0065966

(51) Int. Cl.
| | |
|---|---|
| *F16M 11/38* | (2006.01) |
| *F16M 11/10* | (2006.01) |
| *G06F 1/16* | (2006.01) |
| *H05K 5/02* | (2006.01) |
| *F16M 11/40* | (2006.01) |
| *F16M 13/00* | (2006.01) |

(52) U.S. Cl.
CPC ............. *F16M 11/38* (2013.01); *F16M 11/10* (2013.01); *F16M 11/40* (2013.01); *F16M 13/005* (2013.01); *G06F 1/1626* (2013.01); *G06F 1/1681* (2013.01); *H05K 5/0234* (2013.01); *F16M 2200/08* (2013.01)

(58) Field of Classification Search
CPC ........ F16M 11/10; F16M 11/38; F16M 11/40; F16M 13/005; F16M 2200/08; G06F 1/1626; G06F 1/1681; H05K 5/0234
See application file for complete search history.

(56) References Cited

U.S. PATENT DOCUMENTS

| | | | |
|---|---|---|---|
| 6,430,038 B1 * | 8/2002 | Helot | G06F 1/1616 |
| | | | 248/917 |
| 8,264,310 B2 * | 9/2012 | Lauder | G06F 1/1613 |
| | | | 335/219 |

(Continued)

FOREIGN PATENT DOCUMENTS

| | | |
|---|---|---|
| CN | 102858121 A | 1/2013 |
| CN | 103106919 A | 4/2013 |

(Continued)

OTHER PUBLICATIONS

"First Office Action for Application No. 201610065966.2" The State Intellectual Property Office of People's Republic of China, dated Jul. 10, 2017, 27 pages.

*Primary Examiner* — James Wu
(74) *Attorney, Agent, or Firm* — Kunzler Bean & Adamson

(57) ABSTRACT

In one embodiment, an electronic device is disclosed. The electronic device may include a first body. In one embodiment, the electronic device may include a second body. In some embodiments, the second body may include a first end, a second end, and a first deformable structure disposed between the first end and the second end. The first end may be disposed on a first side of the first body. The second body may form a support structure that may support the first body. A method and apparatus are also disclosed.

17 Claims, 18 Drawing Sheets

(56) References Cited

U.S. PATENT DOCUMENTS

| | | | | |
|---|---|---|---|---|
| 9,565,909 | B2* | 2/2017 | Song | A45C 11/00 |
| 2010/0232100 | A1* | 9/2010 | Fukuma | F16G 13/18 |
| | | | | 361/679.01 |
| 2011/0134588 | A1* | 6/2011 | Barnett | F16M 11/10 |
| | | | | 361/679.01 |
| 2012/0188693 | A1* | 7/2012 | Chiang | F16M 11/10 |
| | | | | 361/679.01 |
| 2013/0214661 | A1* | 8/2013 | McBroom | G06F 1/1667 |
| | | | | 312/325 |
| 2013/0216740 | A1* | 8/2013 | Russell-Clarke | B23K 26/38 |
| | | | | 428/33 |
| 2013/0219663 | A1* | 8/2013 | Cai | G06F 1/1681 |
| | | | | 16/371 |
| 2015/0309544 | A1* | 10/2015 | McCracken | G06F 1/182 |
| | | | | 220/826 |

FOREIGN PATENT DOCUMENTS

| | | | |
|---|---|---|---|
| CN | 103631329 | A | 3/2014 |
| CN | 103970200 | A | 8/2014 |
| CN | 102681610 | B | 11/2014 |
| CN | 104731255 | A | 6/2015 |
| WO | 2015151723 | A1 | 10/2015 |

\* cited by examiner

ELECTRONIC DEVICE, METHOD, AND APPARATUS FOR A DEFORMABLE SUPPORT STRUCTURE

FIELD

The present embodiments relate to the technical field of electronic devices, and in particularly, relates to an electronic device, method, and apparatus for a deformable support structure.

BACKGROUND

A tablet personal computer (tablet) may include a touch screen as an input device. The touch screen may allow a user to operate the tablet by using a stylus, touch input, or the like instead of using a keyboard or mouse. A user may hold the tablet and provide input via the touchscreen in various positions and/or orientations.

SUMMARY

In one embodiment, an electronic device is disclosed. The electronic device may include a first body. In one embodiment, the electronic device may include a second body. In some embodiments, the second body may include a first end, a second end, and a first deformable structure disposed between the first end and the second end. The first end may be disposed on a first side of the first body. The second body may form a support structure that may support the first body.

In some embodiments, in response to the electronic device being in a first state, the first end and the second end of the second body may selectively attach to the first side of the first body. In response to the electronic device being in a second state, the first deformable structure may deform and the second end of the second body may extend away from the first side of the first body.

In certain embodiments, the electronic device may include a second deformable structure. The second deformable structure may be disposed on the first end of the second body. The second deformable structure may selectively connect the first end to the first side of the first body. In one embodiment, the first deformable structure or the second deformable structure may include a rotatable hinge rotary shaft or a multi-directional deformable structure. The multi-directional deformable structure may include a flexible material and/or may be deformable along at least two directions.

In one embodiment, the second deformable structure may include a rotating shaft. In response to the electronic device being in a third state, the second deformable structure may rotate the first end of the second body away from the first side of the first body. In one embodiment, the first body may include a first lateral side and a second lateral side that are disposed on opposite sides the first body. The first lateral side and the second lateral side may be disposed adjacent to the first side of the first body. In response to the electronic device being in the third state, a first spacing between the first lateral side and a surface supporting the first body may be less than a second spacing between the second lateral side and the surface. In response to the electronic device being in a fourth state, the second spacing may be less than the first spacing.

In one embodiment, the first body may include a first edge and a second edge adjacent to the first edge. In response to the electronic device being in a fifth state, a first included angle between the first edge and a surface supporting the first body may be less than a second included angle between the second edge and the surface supporting the first body. In response to the electronic device being in a sixth state, the second included angle may be less than the first included angle.

In some embodiments, in response to the electronic device being in a seventh state, the second body may suspend the first body above a surface. The second body suspending the first body above a surface may form a spacing region between the first body and the surface.

In one embodiment, the first deformable structure may include one or more first deformable structures. The first deformable structures may be sequentially disposed at intervals along a direction from the first end to the second end of the second body. In one embodiment, the first side of the first body may include a receiving groove that receives the second body. In some embodiments, the first body may include a portable computing device.

In one embodiment, a method is disclosed. The method may include providing a first body. In some embodiments, the method may include providing a second body. The second body may include a first end, a second end, and a first deformable structure. In certain embodiments, the method may include disposing the first deformable structure between the first end and the second end. In one embodiment, the method may include disposing the first end on a first side of the first body. The second body may form a support structure that may support the first body.

In some embodiment, the method may include disposing a second deformable structure on the first end of the second body. The method may include selectively connecting the second deformable structure to the first side of the first body. In one embodiment, the second deformable structure may include a rotating shaft. The method may include in response to the first and second bodies being in a third state, rotating, through the second deformable structure, the first end of the second body away from the first side of the first body, and forming a first spacing between a first lateral side of the first body and the surface supporting the second body. The spacing may be less than a second spacing between a second lateral side of the first body and the surface. The first lateral side and the second lateral side may be disposed on opposite sides of an end face of the first side of the first body. In some embodiments, in response to the electronic device being in a fourth, the method may include forming the second spacing less than the first spacing.

In one embodiment, the second body including the first deformable structure may include the first deformable structure including one or more first deformable structures. The one or more first deformable structures may include sequentially disposed first deformable structures at intervals along a direction from the first end to the second end.

In one embodiment, an apparatus is disclosed. The apparatus may include a first support structure end. The apparatus may include a second support structure end. The apparatus may include a first deformable structure. The first deformable structure may be disposed between the first support structure end and the second support structure end. In one embodiment, the apparatus may include a second deformable structure that selectively connects to a first side of a computing device.

In one embodiment, in response to the computing device and apparatus being in a first state, the second deformable structure may selectively attach to the first side of the computing device. In response to the computing device and apparatus being in a second state, the second support structure end may extend away from the first side of the computing device.

In some embodiments, the first deformable structure and/or the second deformable structure may include a rotatable hinge rotary shaft. In one embodiment, the first deformable structure and/or the second deformable structure may include a multi-directional deformable structure comprising a flexible material and deformable along at least two directions.

In one embodiment, in response to the computing device and apparatus being in a third state, the second deformable structure may rotate the first end of the second body away from the first side of the first body. In response to the computing device and apparatus being in a seventh state, the first support structure end and the second support structure end may suspend the computing device above a surface that may support the apparatus. The first support structure end and the second support structure end suspending the computing device may form a spacing region between the computing device and the surface. In some embodiments, the first deformable structure may include one or more first deformable structures. The one or more first deformable structures may be sequentially disposed at intervals along a direction from the first support structure end to the second support structure end.

BRIEF DESCRIPTION OF THE DRAWINGS

To describe the technical solutions according to the embodiments of the present invention or the technical solutions in the related art more clearly, accompanying drawings used for describing the embodiments are hereinafter briefly introduced. It is apparent that the accompanying drawings hereinafter are only intended to illustrate some embodiments of the present application.

DETAILED DESCRIPTION

Figure 1:
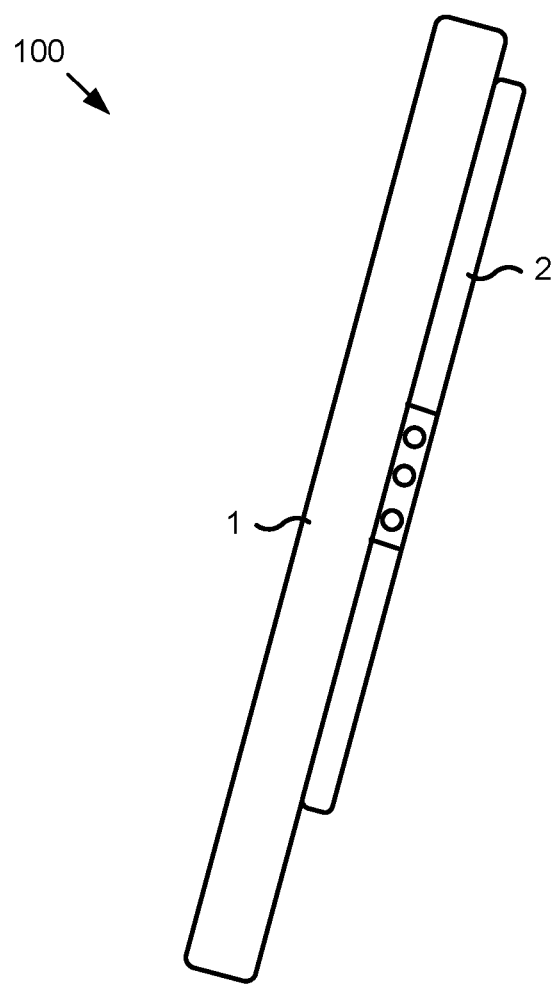
FIG. 1 is a side view illustrating one embodiment of an electronic device in a first state.

FIG. 1 depicts one embodiment of an electronic device 100. The electronic device 100 may include an electronic device for a deformable support structure. The electronic device 100 may include a first body 1. The electronic device 100 may include a second body 2. In one embodiment, an end of the second body 2 may be disposed on the first body 1. In one embodiment, an end of the second body 2 may connect to a side of the first body 1.

Figure 2:
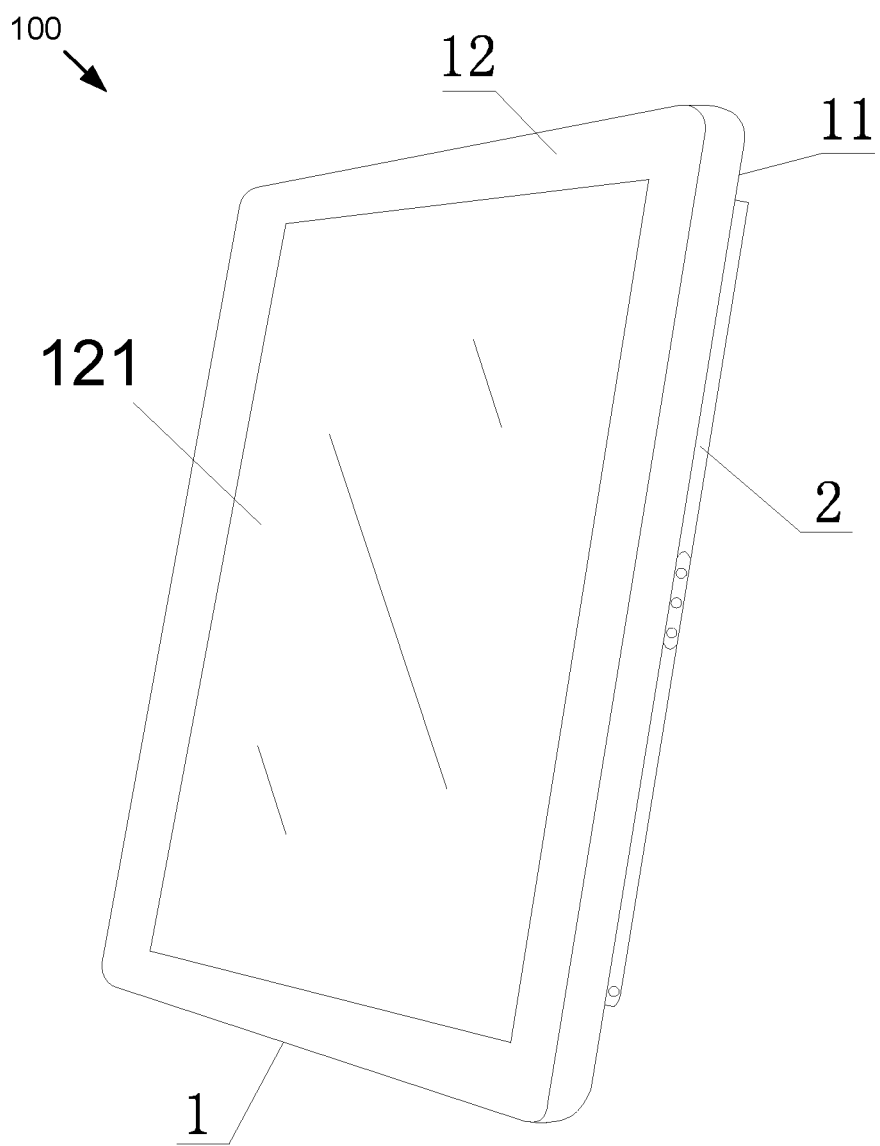
FIG. 2 is a perspective view illustrating one embodiment of an electronic device.
Figure 3:
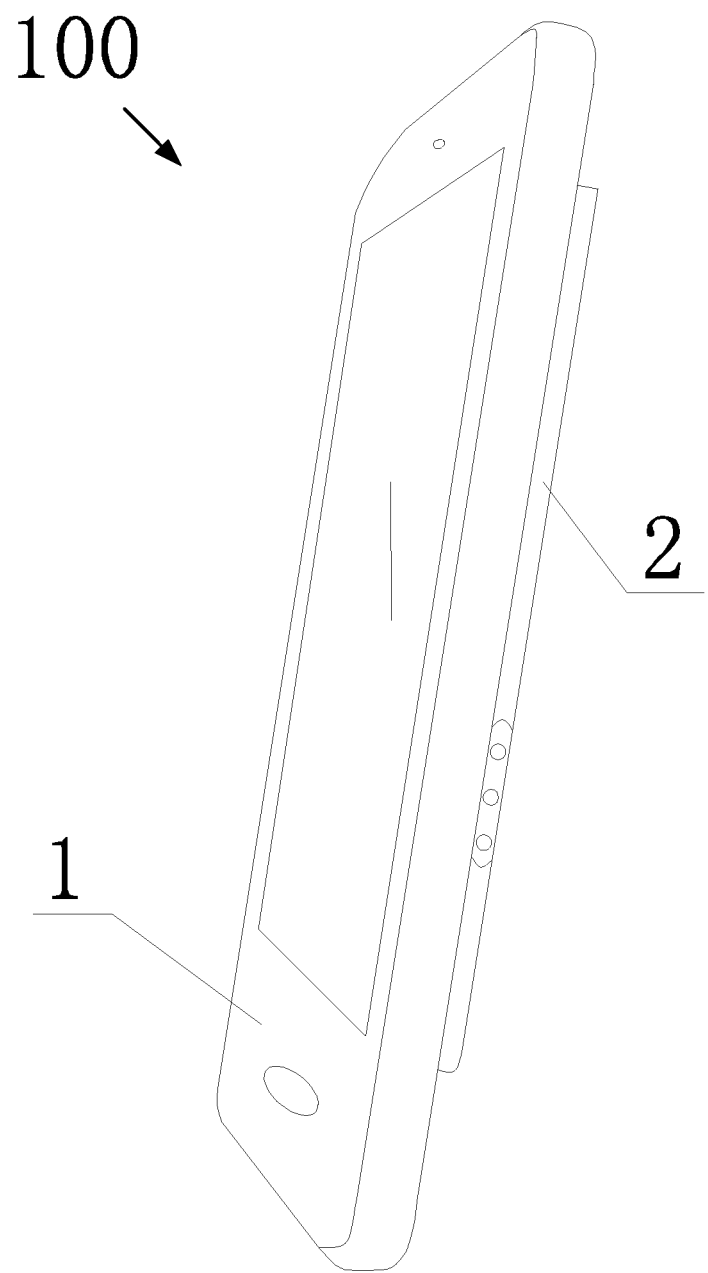
FIG. 3 is a perspective view illustrating one embodiment of an electronic device.

FIG. 2 depicts one embodiment of the electronic device 100. In some embodiments, the first body 1 may include a computing device. In one embodiment, a computing device may include a tablet personal computer (tablet). As used herein, the term "tablet" may include various electronic devices. A tablet may include a tablet personal computer, a phone, a laptop computer, a desktop computer, an electronic device with a touch screen, or the like. For example, FIG. 3 depicts one embodiment of an electronic device 100. In one embodiment, the electronic device 100 may include a mobile phone. The electronic device 100 may include a first side 11 and a second side 12, as described herein.

In one embodiment, the tablet may include a first side 11 and a second side 12. The second side 12 may include a display screen 121. The first side 11 may be disposed opposite to the second side 12. The tablet may connect to an end of the second body 2 via the first side 11. In some embodiments, FIGS. 1-3 depict the electronic device 100 in a first state. In one embodiment, the first state may include the second body 2 disposed flat against the first side 11 of the first body 1.

As illustrated in FIG. 2, the first side 11 of the tablet may include a flat surface. The support structure may attach to the first side 11 of the tablet. In one embodiment, the support structure may project from the first side 11 of a tablet. In the first usage state, the electronic device 100 may include a small size. A user may hold the electronic device 100 and operate the electronic device 100. In one embodiment, the first usage state may also be referred to as a flat plate state. In one embodiment, the support structure may project from the first side 11 of the tablet. In response, the portability, aesthetic, or the like of the electronic device 100 may be affected.

Figure 4:
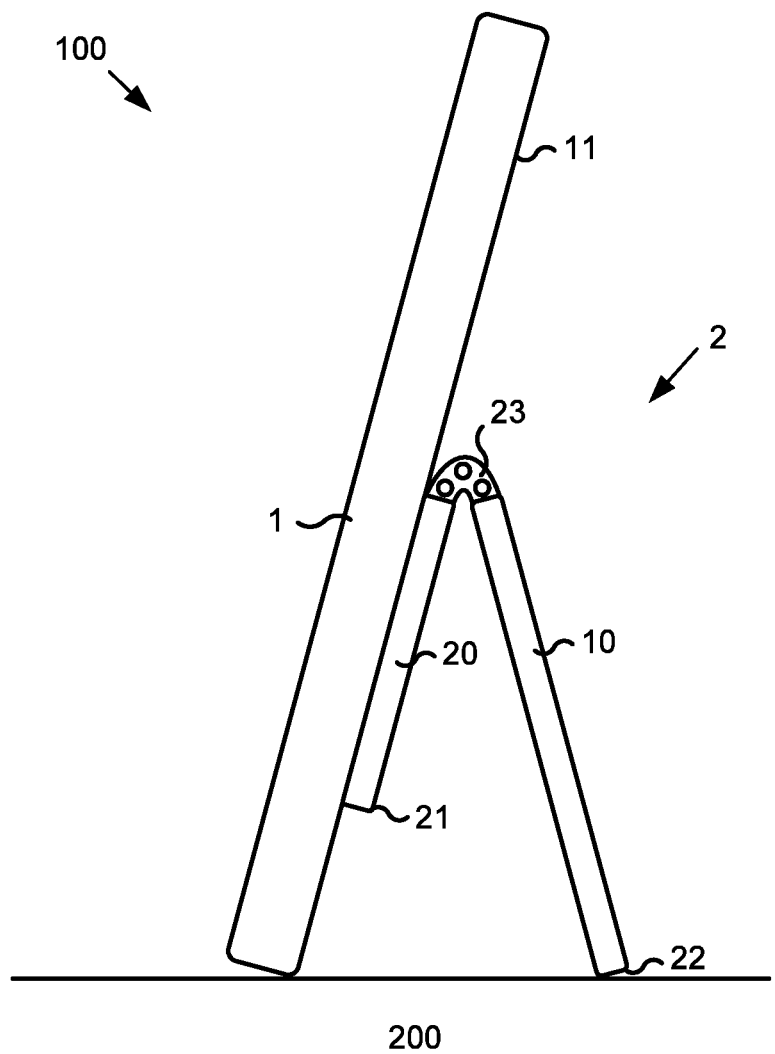
FIG. 4 is a side view illustrating one embodiment of an electronic device in a second state.

FIG. 4 depicts one embodiment of the electronic device 100. In one embodiment, the second body 2 may include a support structure. The support structure may include a first end 21, a second end 22, and a first deformable structure 23. The first deformable structure 23 may be disposed between the first end 21 and the second end 22. The first deformable structure 23 may include a structure that moves the first end 21 relative to the second end 22. In one embodiment, the first deformable structure 23 may include a hinge rotary shaft structure capable of rotating about an axis. For example, the hinge rotary shaft may be capable of rotating a certain number of degrees, a range of degrees, or the like. For example, in one embodiment, the first deformable structure 23 may rotate 360 degrees, less than 360 degrees, or the like. In one embodiment, the support structure may connect to one side of the first body 1 via the first end 21.

In some embodiments, the support structure may include a first support member 10 and a second support member 20. The first support member 10 may be disposed on the first end 21. The second support member 20 may be disposed on the second end 22. In one embodiment, a length of the first support member 10 may be substantially equal to a length of the second support member 20. In one embodiment, a length of the first support member 10 may be different than a length of the second support member 20. An end of the first support member 10 may connect to an end of the second support member 20 via the first deformable structure 23. An end of the second support member 20 may be disposed opposite the first deformable structure 23. The end of the second support member 20 may be used as the first end 21 of the support structure. An end of the first support member 10 may be disposed opposite the first deformable structure 23. The end of the first support member 10 may be used as the second end 22 of the support structure. In one embodiment, the first support member 10 and/or the second support member 20 may include support plates.

In one embodiment, the first support member 10 and the second support member 20 may include support rods. The first deformable structure 23 may include a multi-directional deformable structure deformable along at least two directions. The multi-directional deformable structure may include a flexible material. For example, the flexible material may include a deformable metal sheet or the like.

Figure 5:
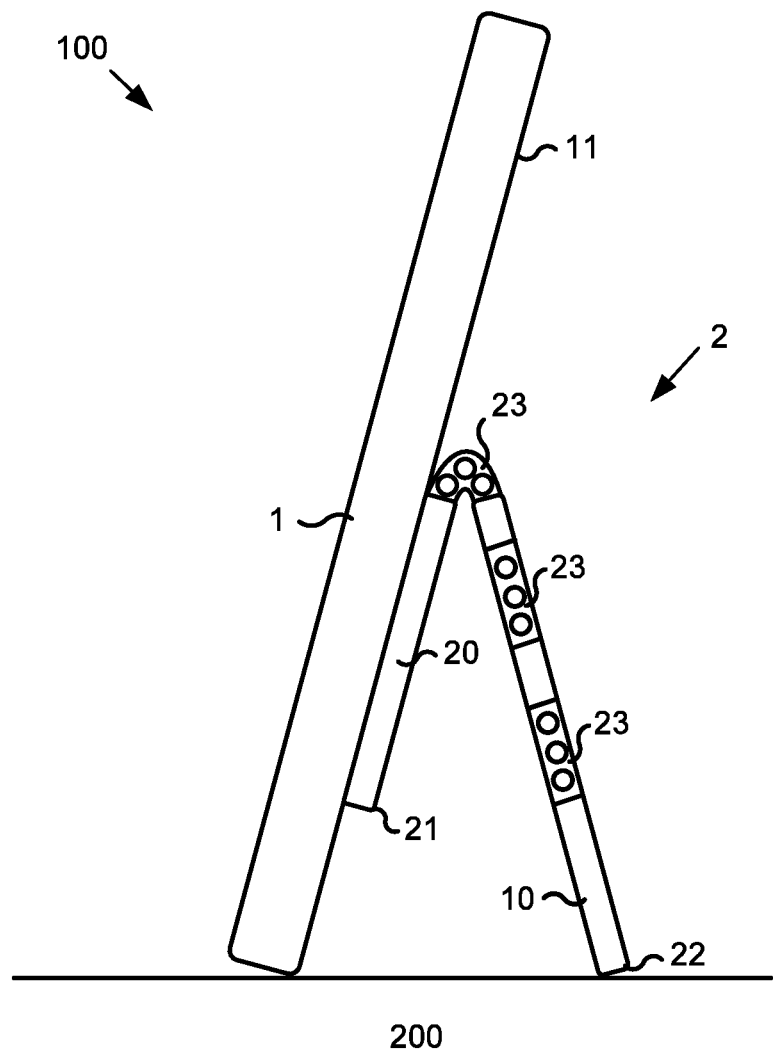
FIG. 5 is a side view illustrating one embodiment of an electronic device in the second state.

In one embodiment, as depicted in FIG. 4, the second support member 20 may be disposed on the first side 11 of the first body 1, the first deformable structure 23 may be deformed (for example, a user may rotate a hinge rotary shaft), and in response, the first support member 10 may rotate away from the first body 1. A side of the first body 1 may rest on a bearing surface 200 and the second end 22 may rest on the surface. In response, the first body may be in a position for viewing, use, or the like by a user. In one embodiment, the second body 2, the varies components of the second body 2, or the like may include a shape. The shape of the second body 2 may include one or more of a variety of shapes. For example, the shape of the second body 2 may include a rectangular shape (as depicted, for example, in FIGS. 6 and 16 below), a forked shape (as depicted, for example, in FIG. 17 below) or the like. The shape of the second body 2 may facilitate the second body in supporting the first body 1002E FIG. 5 depicts one embodiment of an electronic device 100. In one embodiment, the first deformable structure 23 may include one or more first deformable structures 23. The one or more first deformable structures 23 may be sequentially arranged at intervals along a direction from the first end 21 to the second end 22. The one or more sequential first deformable structures 23 may deform. In response to the one or more first deformable structures 23 deforming, the support structure to fold one or more times and/or enable the electronic device 100 to include one or more deformation forms.

In some embodiments, the one or more first deformable structures 23 may all include the same type of deformable structure. In one embodiment, the one or more first deformable structures 23 may include different types of deformable structures. In one embodiment, the one or more first deformable structures 23 may each include the same length in between each other. In one embodiment, the spacing in between some of the first deformable structure 23 may be different.

In some embodiments, in response to the first deformable structure 23 deforming (for example, rotating about an axis or the like), the relative locations of the first body 1 and the second body 2 may change. In response, the form, shape, orientation, or the like of the electronic device 100 may change. The first deformable structure 23 may enable the second body 2 to include one or more structural forms such that the electronic device 100 may include one or more corresponding usage states, modes, or the like. For example, in some embodiments, FIG. 4-5 may depict the electronic device 100 in a second state. The second state, in one embodiment, may include the length of the second support member 20 disposed on the first side 11 of the first body 1, the first deformable structure 23 deformed, and the first support member 10 extending away from the first body 1.

As illustrated in FIG. 4, the first deformable structure 23 may deform such that the second end 22 may move away from the first side 11. In response, the first deformable structure 23 may form a first support form for supporting the tablet. The first support form may be referred to as a standing state. In the first support form, the second end 22 may connect to an edge of the tablet. In response to the second end 22 connecting to an edge of the tablet, the second end 22 may provide support for the tablet. The term "connect," in some embodiments, may include the second end 22 and the edge of the tablet being both in contact with the bearing surface 200 to form a stable support structure.

In some embodiments, the electronic device 100 may retain its target form in response to deformation in a stable state. A matched damping force may be generated in response to the first deformable structure 23 deforming into the target form. In one embodiment, the first deformable structure 23 may remain in the target form. For example, the first deformable structure 23 may include a damping rotary shaft structure.

Figure 6:
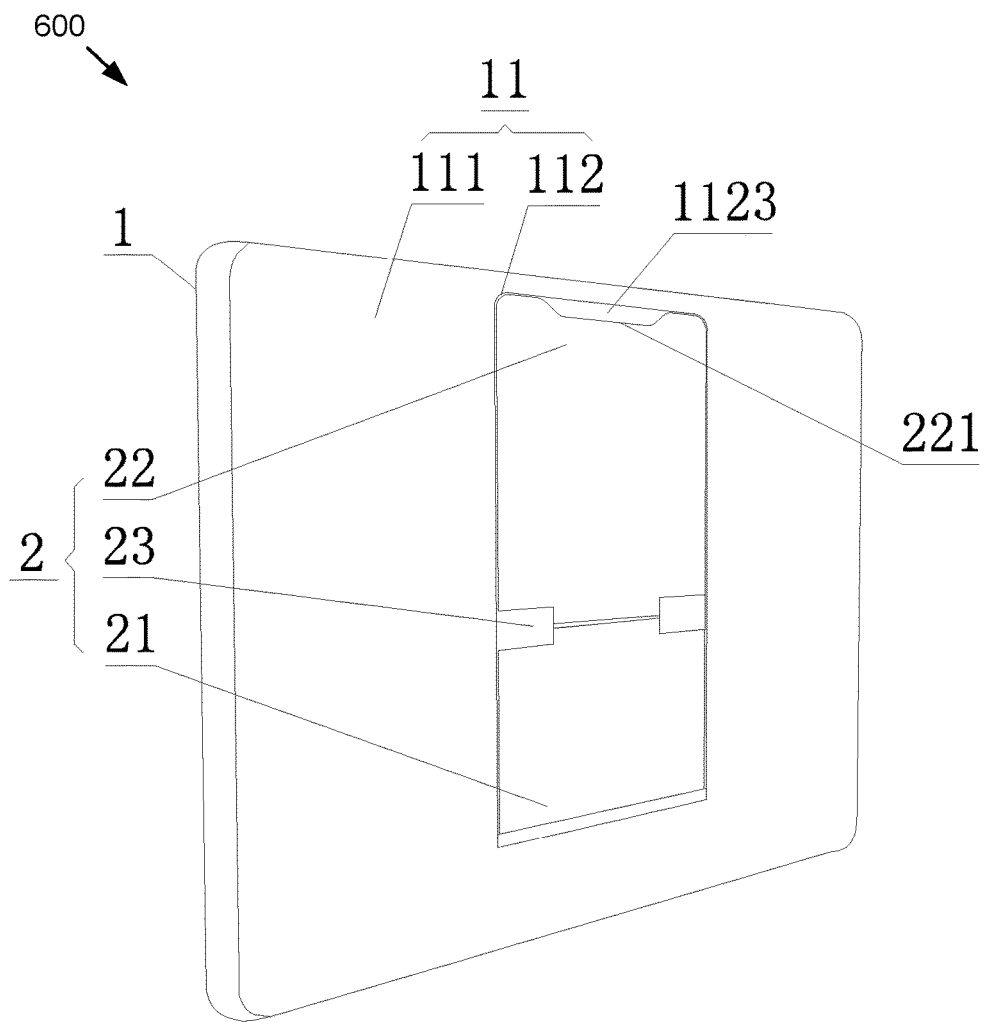
FIG. 6 is a perspective view illustrating one embodiment of an electronic device.
Figure 7:
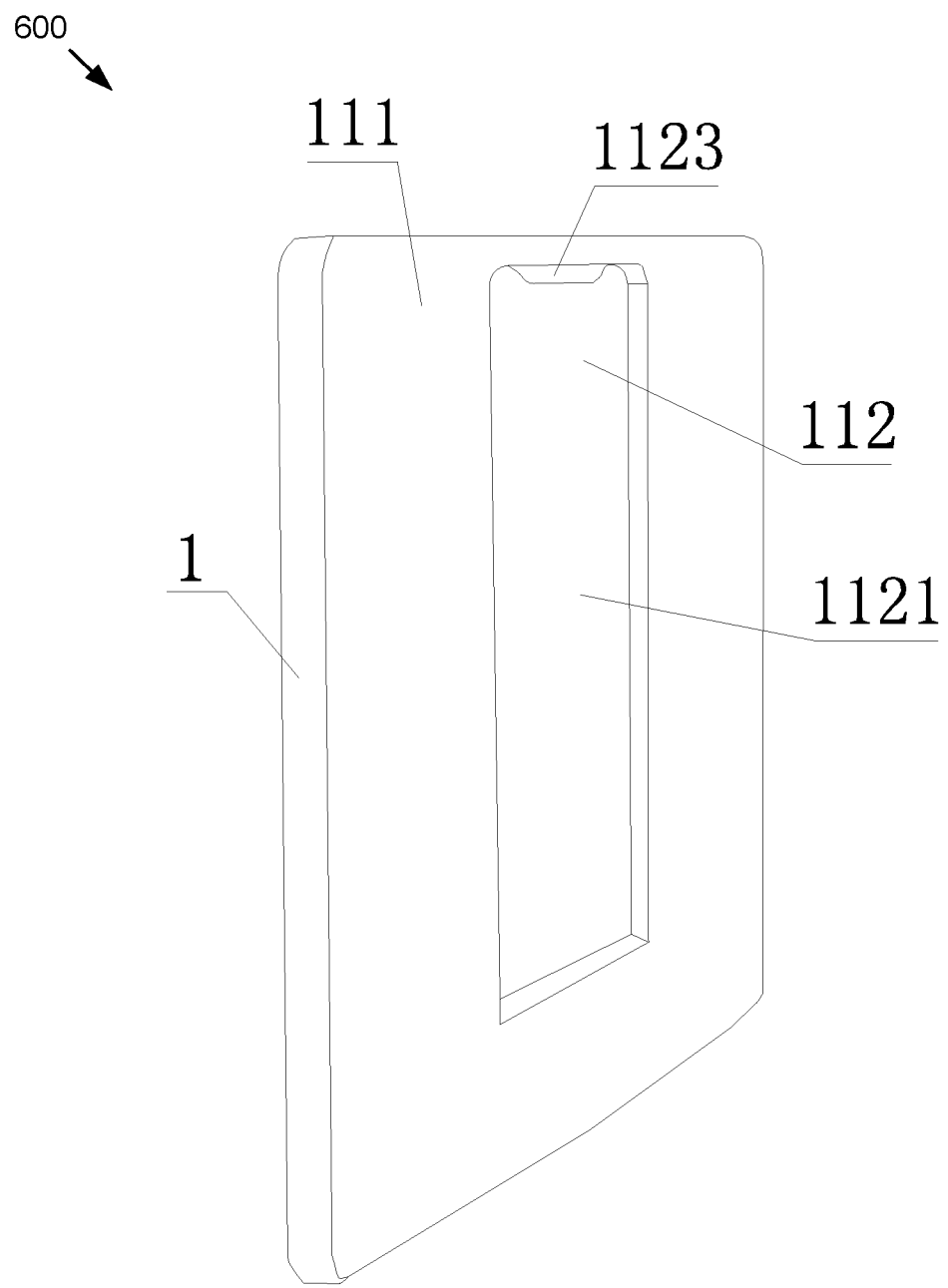
FIG. 7 is a perspective view illustrating one embodiment of a first body of the electronic device.

FIG. 6 depicts one embodiment of electronic device 600 in the first state. FIG. 7 depicts one embodiment of a first body 1 of the electronic device 600. As illustrated in FIG. 6 and FIG. 7, the first side 11 may include a first side end face 111 of the tablet. The first side 11 may include a receiving apparatus 112. In some embodiments, the receiving apparatus 112 may be disposed on the first side end face 111. The receiving apparatus 112 may include a receiving groove 1121. The receiving groove 1121 may include a groove arranged on the first side end face 111. The support structure may be disposed in the receiving groove 1121 and attach to a bottom of the receiving groove 1121. In one embodiment, the receiving groove 1121 arranged on the first side end face 111 may allow the electronic device 100 to be compact in the first sate. The receiving groove 1121 may include a concave shape. The electronic device 100 being compact may include the support structure fitting inside the receiving groove 1121, in whole or in part. The support structure fitting inside the receiving groove 1121 in whole may include an outer side of the support structure being flush with the first side end face 111. In certain embodiments, such configuration may facilitate holding of the electronic device by the user and/or may achieve a more simple appearance.

Figure 8:
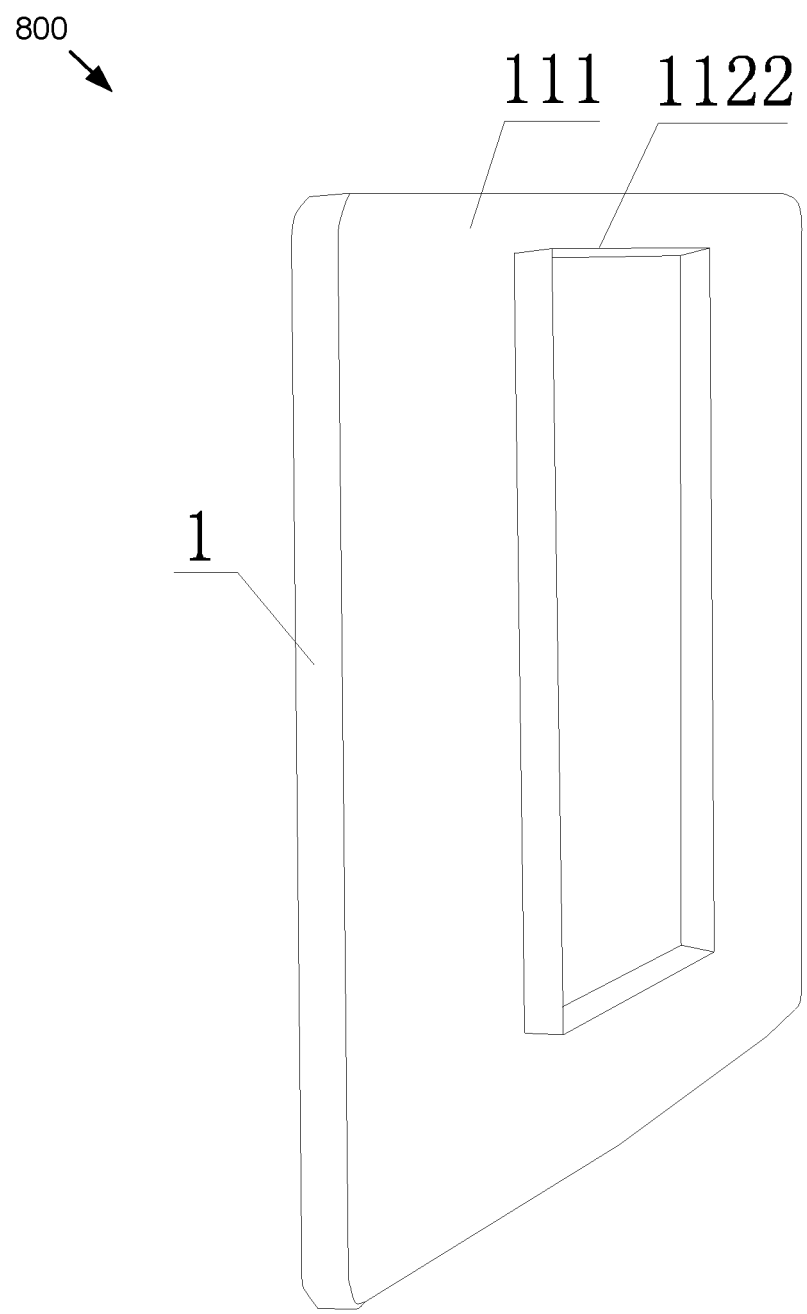
FIG. 8 is a perspective view illustrating one embodiment of a first body of an electronic device.

FIG. 8 depicts one embodiment of a first body 1 of an electronic device 800. In one embodiment, as illustrated in FIG. 8, the receiving groove 1121 may include the receiving apparatus 112. The receiving apparatus 112 may include a receiving box 1122. The receiving box 1122 may include an opening on one end. In some embodiments, the receiving box 1122 may be disposed on the first side end face 111. In response to the electronic device 800 being in the first usage state, the support structure may be received in the receiving box 1122 and/or disposed on a bottom of the receiving box 1122.

In one embodiment, in response to the support structure being received on the first side 11 of the tablet, the support structure and the first side 11 of the tablet may form an integral structure. The "integral structure" herein may refer to one or more locations of the first side 11 of the tablet personal and the support structure being relatively fixed to avoid swinging of the support structure. For example, to facilitate the support structure being received on the first side 11 of the tablet, the support structure and the first side 11 may form an integral structure, as illustrated in FIG. 6 and FIG. 7. The groove wall of the receiving groove 1121 may include a buckle 1123. The second end 22 of the support structure may include a buckle groove 221. The buckle groove may connect with the buckle 1123. In response to the support structure being received in the receiving groove 1121, the buckle groove 221 on the support structure may connect (for example, being snap-fit and secured) to the buckle 1123 on the receiving groove 1121. In one embodiment, the buckle groove 221 connecting to the buckle 11223 may include the support structure and the first side 11 forming an integral structure. In response to the user toggling the support structure with his or her fingers or nails, the buckle 1123 may release from the buckle groove 221.

In some embodiments, in response to the support structure being received on the first side 11 of the tablet, the support structure and the first side 11 of the tablet may achieve an integral structure via a hook and loop fastener, a screw assembly, or the like.

Figure 9:
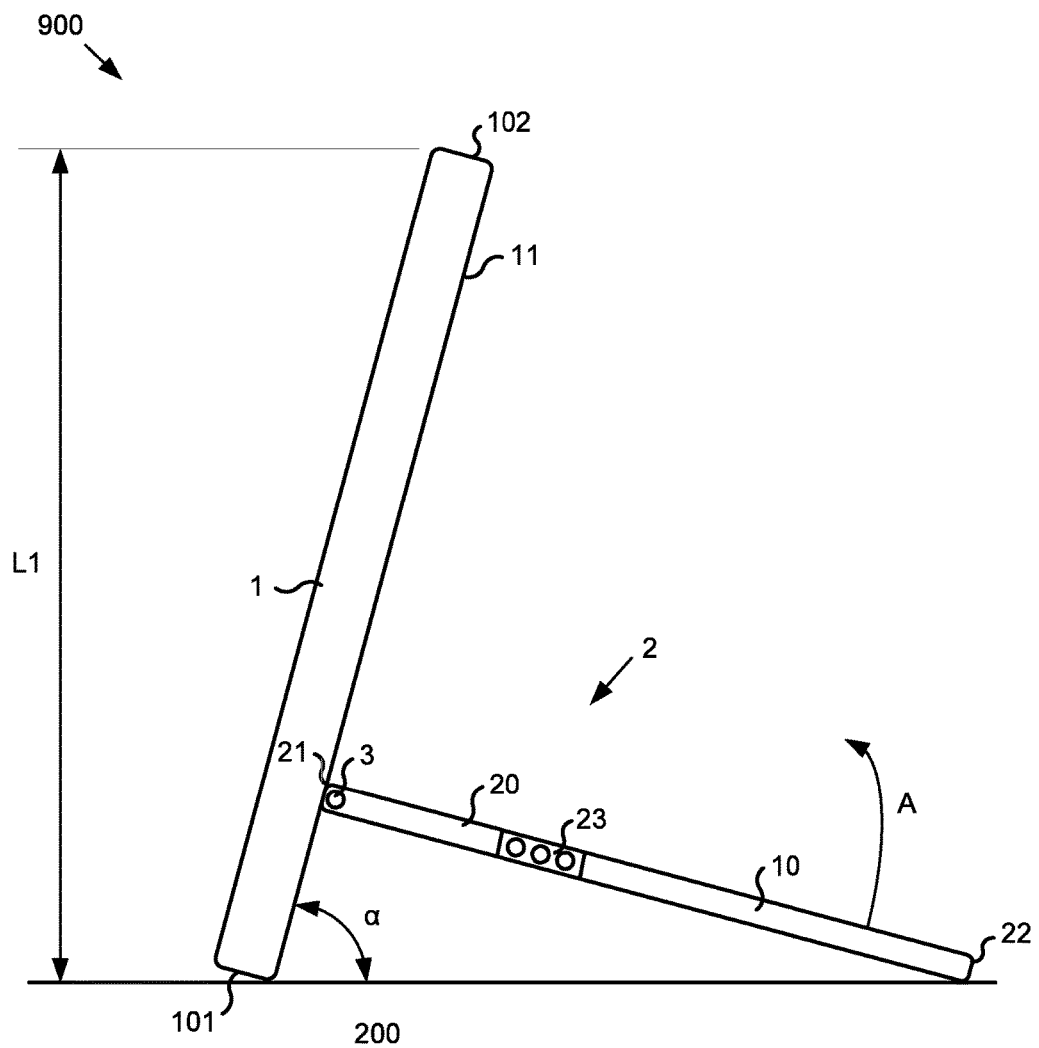
FIG. 9 is a side view illustrating one embodiment of an electronic device in a third state.

FIG. 9 depicts one embodiment of an electronic device 900 in a third state. The electronic device 900 may include a second deformable structure 3. The second deformable structure 3 may connect the first end 21 of the support structure to the first side 11 of the tablet. In response, the first end 21 of the support structure may connect to the first side 11 of the tablet. In one embodiment, the second deformable structure 3 may connect to the first deformable structure 23 such that the electronic device 900 may include multiple deformation forms. The electronic device 900 including multiple deformation forms may include the electronic device 900 including multiple corresponding usage forms. The multiple corresponding usage forms may include multiple usage forms corresponding to a single deformation form or a single usage form corresponding to a single deformation form. In one embodiment, the first deformable structure 23 and the second deformable structure 3 may include a hinge rotary shaft structure capable of rotating 360 degrees. The hinge rotary shaft of the first deformable structure 23 may be disposed parallel to the hinge rotary shaft of the second deformable structure 3. For example, in one embodiment, the first support member 10 and the second support member 20 may rotate towards the same direction via the first deformable structure 23 and the second deformable structure 3.

In certain embodiments, the first deformable structure 23 and the second deformable structure 3 may include a multi-directional deformable structure that may be deformable along at least two directions. The multi-directional deformable structure may include a flexible material, for example, a deformable metal sheet, or the like. The first deformable structure 23 and the second deformable structure 3 may include combinations of the hinge rotary shaft structure capable of rotating 360 degrees and the multi-directional deformable structure. For example, the first deformable structure 23 and the second deformable structure 3 may respectively include a hinge rotary shaft structure capable of rotating 360 degrees or a multi-directional deformable structure, or vice-versa. The detailed combination may be made according to the actual needs of the user such that the electronic device 900 may include at least the above various deformation forms.

In one embodiment, the electronic device 900 may retain its target shape in response to deformation in a stable state. A matched damping force may be generated in response to the second deformable structure 3 deforming into the target shape such that second deformable structure 3 remains in the target shape. For example, the second deformable structure 3 may include a damping rotary shaft structure. In some embodiments, an unmatched damping force may be generated in response to deformation in a stable state. The unmatched damping force may slow movement of the deformation and facilitate the electronic device 900 in deforming into another state in a stable manner. In one embodiment, the damping force may allow the electronic device 900 to retain its shape in response to gravity acting upon the first body 1 and/or the second body 2 and may allow the electronic device 900 to deform in response to a user manipulating the electronic device 900. In one embodiment, the second deformable structure 3 may include a fastening and connecting member, for example, a bolt, or the like. In some embodiments, the first end 21 of the second body 2 may connect to the first side 11 of the first body 1 via the fastening and connecting structure.

As illustrated in FIG. 9, in one embodiment, in response to the electronic device 900 being in the third usage state, the second deformable structure 3 may deform such that the first end 21 of the support structure may rotate away from the first side 11 with the second deformable structure 3 as a rotation axis. In response, the support structure may form a second support form for supporting the tablet. The second support form may be referred to as a standing form. In some embodiments, in response to the electronic device 900 being in the third state, the first deformable structure 23 may not deform and only the second deformable structure 3 may deform. In the second support form, the second end 22 may connect to the edge of the tablet to provide support for the tablet. The term "connect" may include the second end 22 and the edge of the tablet being in contact with the bearing surface 200 to form a stable support structure. In response to the first end 21 of the support structure rotating away from the first side 11 with the second deformable structure 3 as a rotation axis and the rotation angle changing, the second support form of the electronic device 900 include different states.

As illustrated in FIG. 9, in one embodiment, the tablet may include a first lateral side 101 and a second lateral side 102. The first lateral side 101 and second lateral side 102 may be disposed on opposing sides of the first side 11. In one embodiment, the first side 11 may include a side of the tablet that is disposed opposite to the display screen. The first lateral side 101 and the second lateral side 102 may be, respectively, an upper lateral side and a lower lateral side of the tablet. A first spacing between the first lateral side 101 and the bearing surface 200 supporting the tablet personal computer may include a space less than a second spacing L1 between the second lateral side 102 and the bearing surface 200. In some embodiments, as depicted in FIG. 9, the first spacing between the first lateral side 101 and the bearing surface 200 supporting the tablet may be a length of zero (no spacing), that is, the first lateral side 101 may be in contact with the bearing surface 200.

Figure 10:
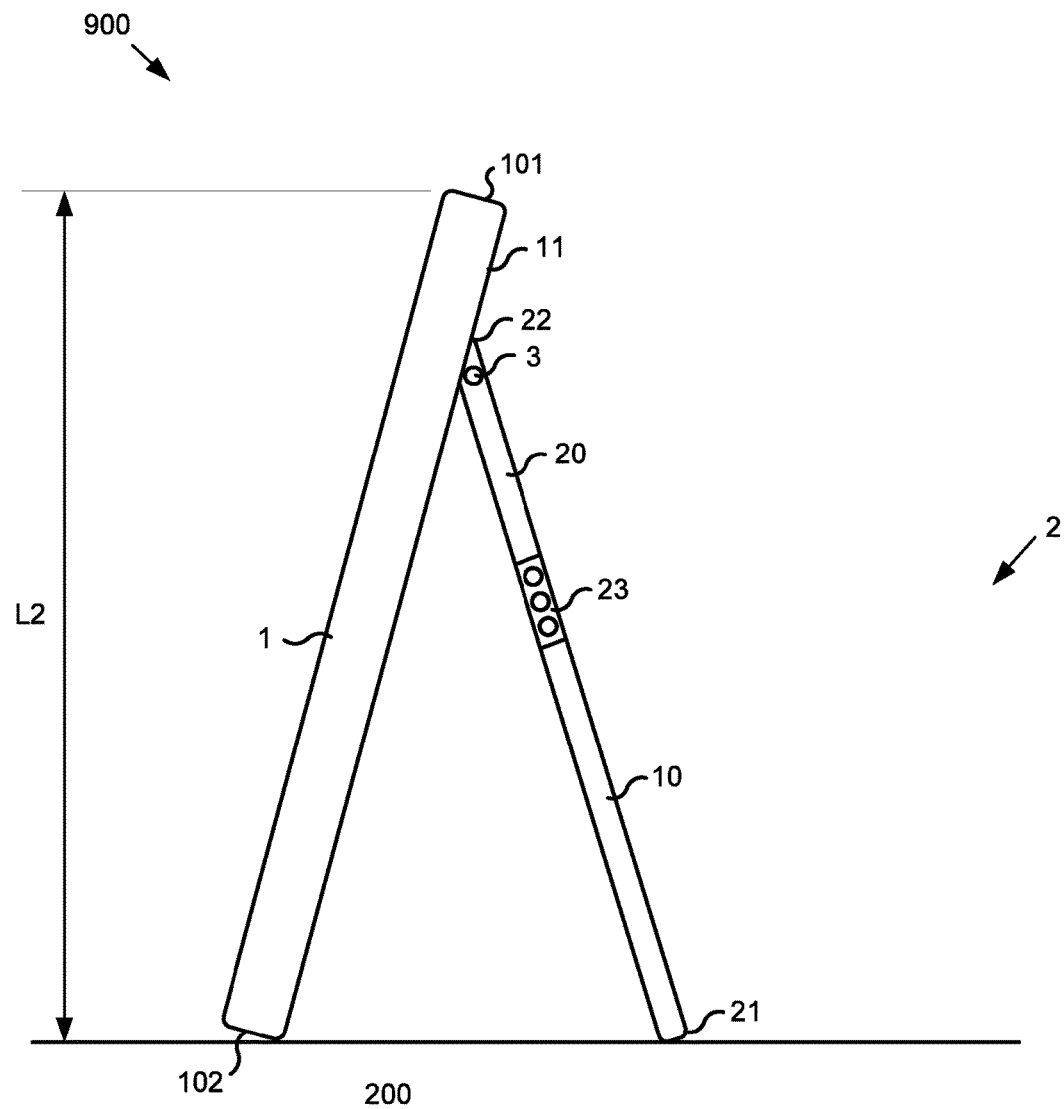
FIG. 10 is a side view illustrating one embodiment of the electronic device in a fourth state.

FIG. 10 one embodiment of the electronic device 900 in a fourth state. As illustrated in FIG. 10, in the fourth state, a first spacing between the second lateral side 102 and the bearing surface 200 is less than the second spacing L2 between the first lateral side 101 and the bearing surface 200 supporting the tablet. In one embodiment, the spacing between the second lateral side 102 and the bearing surface 200 supporting the tablet may be zero (no spacing), that is, the second lateral side 102 is in contact with the bearing surface 200.

As depicted in FIG. 9, the support structure in FIG. 9 may rotate towards the direction indicated by the arrow A. The second deformable structure 3 may include a rotation axis such that the electronic device 100 may be switched between the third state and the fourth state. Switching between the third state and the fourth state may include rotating the electronic device 900. For example, as depicted in FIG. 9, in the third state, the first lateral side 101 may contact the bearing surface 200. In response to rotating the electronic device 900, the second lateral side 102 may contact the bearing surface 200 and the first support member 10 may rotate in the direction indicated by the arrow A.

In some embodiments, as illustrated in FIG. 9 and FIG. 10, in response to the electronic device 900 switching between the third state and the fourth state, an absolute value of a difference between the first spacing and the second spacing L1 in the third state may be equal to an absolute value of the difference between the first spacing and the second spacing L2 in the fourth state. In one embodiment, in these two states, an angle between the first side end face 111 of the first side 11 of the tablet and the bearing surface 200 may remain unchanged. In response to the display screen of the tablet being disposed opposite to the first side end face 111 of the first side 11, an angle between the display screen and the bearing surface 200 may also remain unchanged. In some embodiments, the angle between the display screen and the bearing surface 200 may be designed to be an optimal angle suitable for a user to view the display screen. The optimal angle may include an angle such that regardless of whether the electronic device 900 is deformed to the third state or the fourth state of the first support form, the user may conveniently operate and/or view the tablet.

Figure 11:
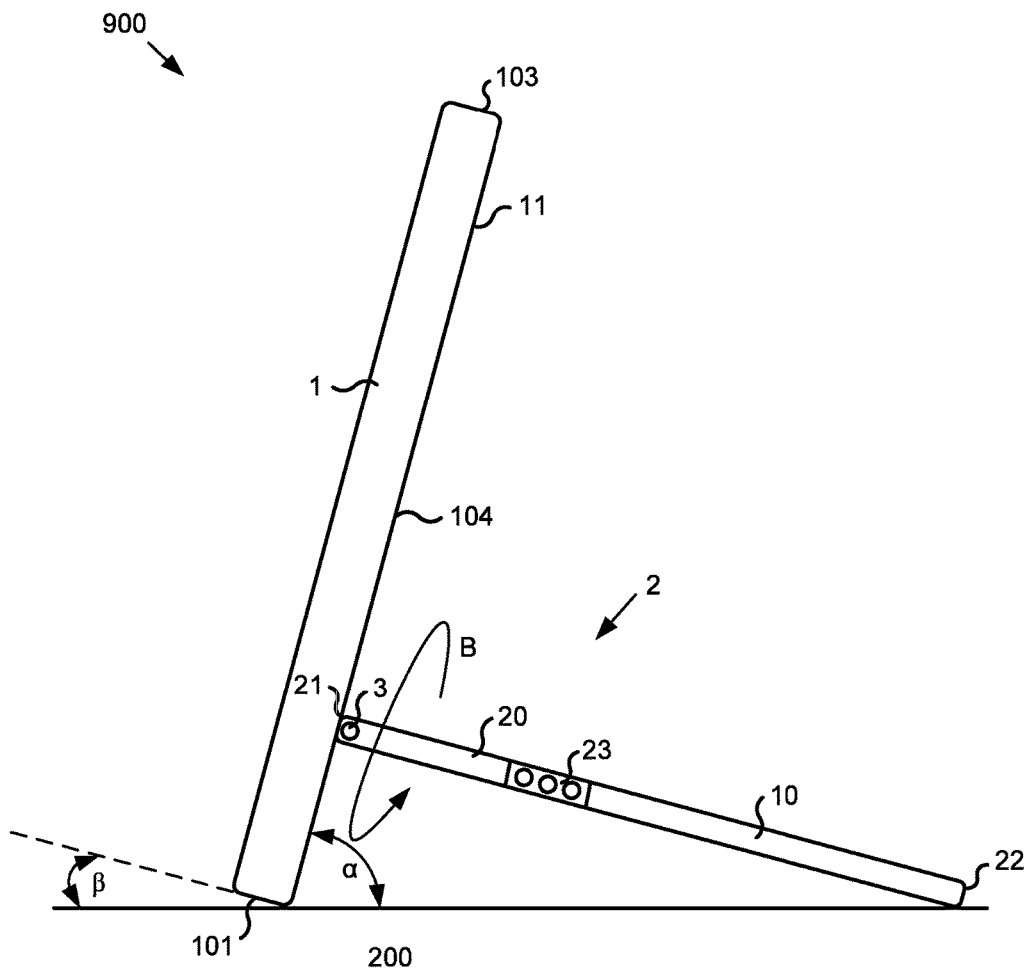
FIG. 11 is a side view illustrating one embodiment of an electronic device in a fifth state.

FIG. 11 depicts one embodiment of the electronic device 900 in a fifth state. As illustrated in FIG. 11, the tablet may include a first edge 103 and a second edge 104. The first edge 103 and second edge 104 may be adjacently disposed. In the fifth state, a first included angle β between the first edge 103 and the bearing surface 200 supporting the tablet may be less than a second include angle a between the second edge 104 and the bearing surface 200. In one embodiment, the first edge 103 may be parallel to the bearing surface 200. The first edge 103 being parallel to the bearing surface 200 may include the first included angle β between the first edge 103 and the bearing surface 200 being zero. For the convenience of a user to view the display screen of the tablet, in the fifth state of the second support form, the second included angle α between the second edge 104 and the bearing surface 200 may include an angle from 90degrees to 110 degrees.

Figure 12:
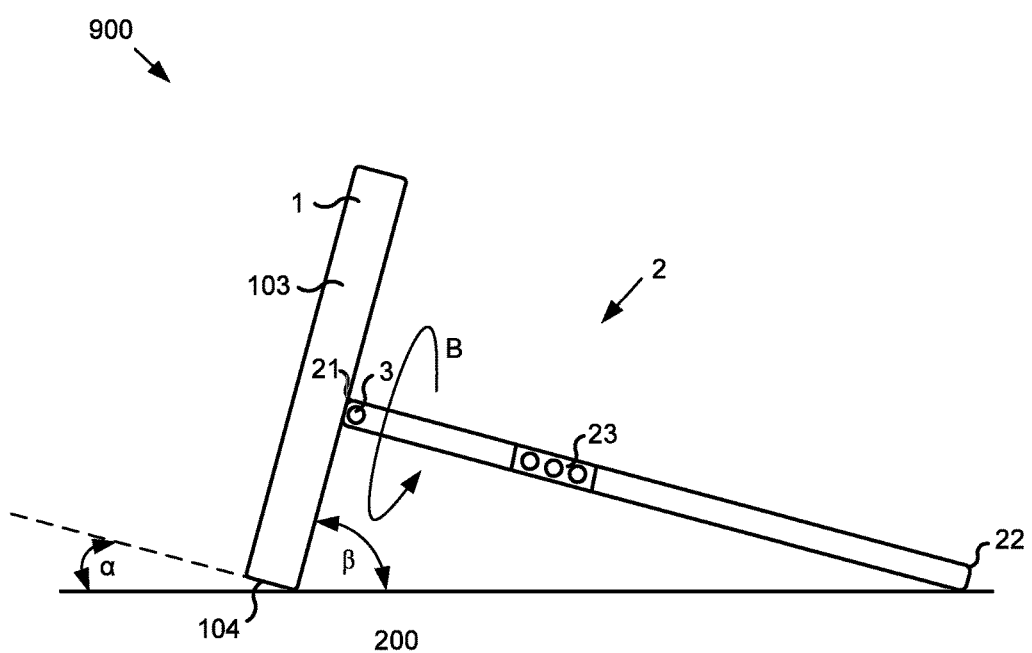
FIG. 12 is a side view illustrating one embodiment of an electronic device in a sixth state.

FIG. 12 depicts one embodiment of the electronic device 900 in a sixth state of the second support form. As illustrated in FIG. 12, in the sixth state, the second included angle between the second edge 104 and the bearing surface 200 supporting the tablet personal computer may be less than the first included angle θ between the first edge 103 and the bearing surface 200 supporting the tablet. In one embodiment, the second edge 104 may be substantially parallel to the bearing surface 200. In one embodiment, the second edge being substantially parallel to the bearing surface 200 may include the second included angle between the second edge 104 and the bearing surface 200 supporting the tablet personal computer being zero. In some embodiments, for the convenience of a user to view programs on the tablet, in the sixth state of the second support form, the first included angle between the first edge 103 and the bearing surface 200 may include an angle from 90 degrees to 110 degrees.

As illustrated in FIG. 11, the tablet may rotate towards the direction indicated by the arrow B. The second deformable structure 3 may act as a rotation axis to the location as illustrated in FIG. 12. In one embodiment, the electronic device 900 may switch between the fifth state and the sixth state of the second support form. In some embodiments, the some states of the electronic device 100, 600, 800, or 900 may include the same state. For example, in one embodiment, the third state and the fifth state may include the same state.

In certain embodiments, the screen of the tablet may include an automatic rotation function. In one embodiment, in response to the state of the electronic device 900 changing, the screen of the tablet may adaptively rotate. This may provide usage applicability for the deformation of the electronic device 900 in the second support form, and may facilitate the user in conveniently operating the tablet.

Figure 13:
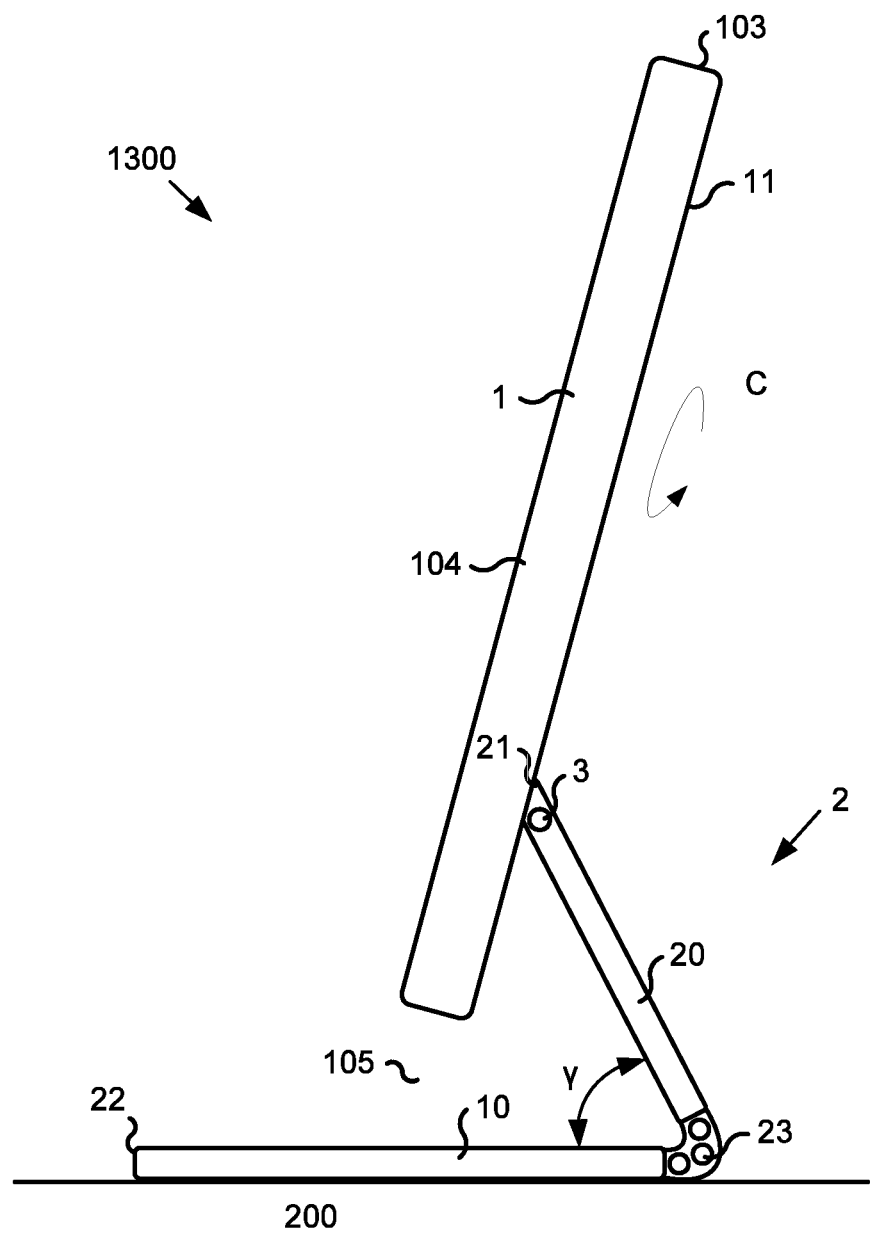
FIG. 13 is a side view illustrating one embodiment of an electronic device in a seventh state.

FIG. 13 depicts one embodiments of an electronic device 1300 in a seventh state. As illustrated in FIG. 13, in the seventh state, the first deformable structure 23 and the second deformable structure 3 may include deformations. The deformations may be in response to user manipulation or the like. In one embodiment, the locations of the first end 21 and the second end 22 of the support structure may form a third support form for supporting the tablet. The third support form may be referred to as a standing form. In one embodiment, the tablet may be disposed over the bearing surface 200. For example, the tablet may be suspended over the bearing surface 200 of the support structure by the support structure. A spacing region 105 may be disposed between the tablet and the bearing surface 200. The spacing region 105 may reduce abrasion of the tablet from contact between the tablet and the bearing surface 200.

In one embodiment, in the third support form, the first support member 10 may be in contact with the bearing surface 200, and the second support member 20 may be in the standing state. The second support member 20 may include a support beam. The first support member 10 and the second support member 20 may form an included angle between the first support member 10 and the second support member 20. In some embodiments, the first support member 10 and the second support member 20 may form an angle γ. The angle γ may include an angle from 30 degrees to 60 degrees (as illustrated in FIG. 13). In one embodiment, in response to the electronic device 1300 being in the fourth usage stage, the tablet may contact the bearing surface 200.

In some embodiments, the support structure may provide stable support for the tablet by providing a contact area between the first support member 10 and the bearing surface 200. In one embodiment, the larger the contact area, the more stability the support may be. As illustrated in FIG. 9 and FIG. 10, the first support member 10 and the second support member 20 may include an equal width The length of the first support member 10 may be greater than the length of the second support member 20.

In one embodiment, in response to the electronic device 1300 being in the seventh state, the tablet may rotate with the second deformable structure 3 as a rotation axis. The included angle between the first side end face 111 of the first side 11 of the tablet and the support structure may remain unchanged. In response to the tablet rotating at different angles relative to the support structure with the second deformable structure 3 as a rotation axis, the electronic device 1300 may include different structures and forms in the third support form. The electronic device 100 may include multiple corresponding states.

As illustrated in FIG. 13, in the seventh state, a third included angle between the first edge 103 of the tablet and the bearing surface 200 supporting the tablet personal computer may be less than a fourth included angle between the second edge 104 of the tablet personal computer and the bearing surface 200 supporting the tablet personal computer. In one embodiment, the first edge 103 may be substantially parallel to the bearing surface 200. In one embodiment, the first edge 103 being substantially parallel to the bearing surface 200 may include the third included angle between the first edge 103 and the bearing surface 200 supporting the tablet personal computer being zero. In some embodiments, for the convenience of a user, in the seventh state, the fourth included angle between the second edge 104 and the bearing surface 200 may include an angle from 90 degrees to 110 degrees.

Figure 14:
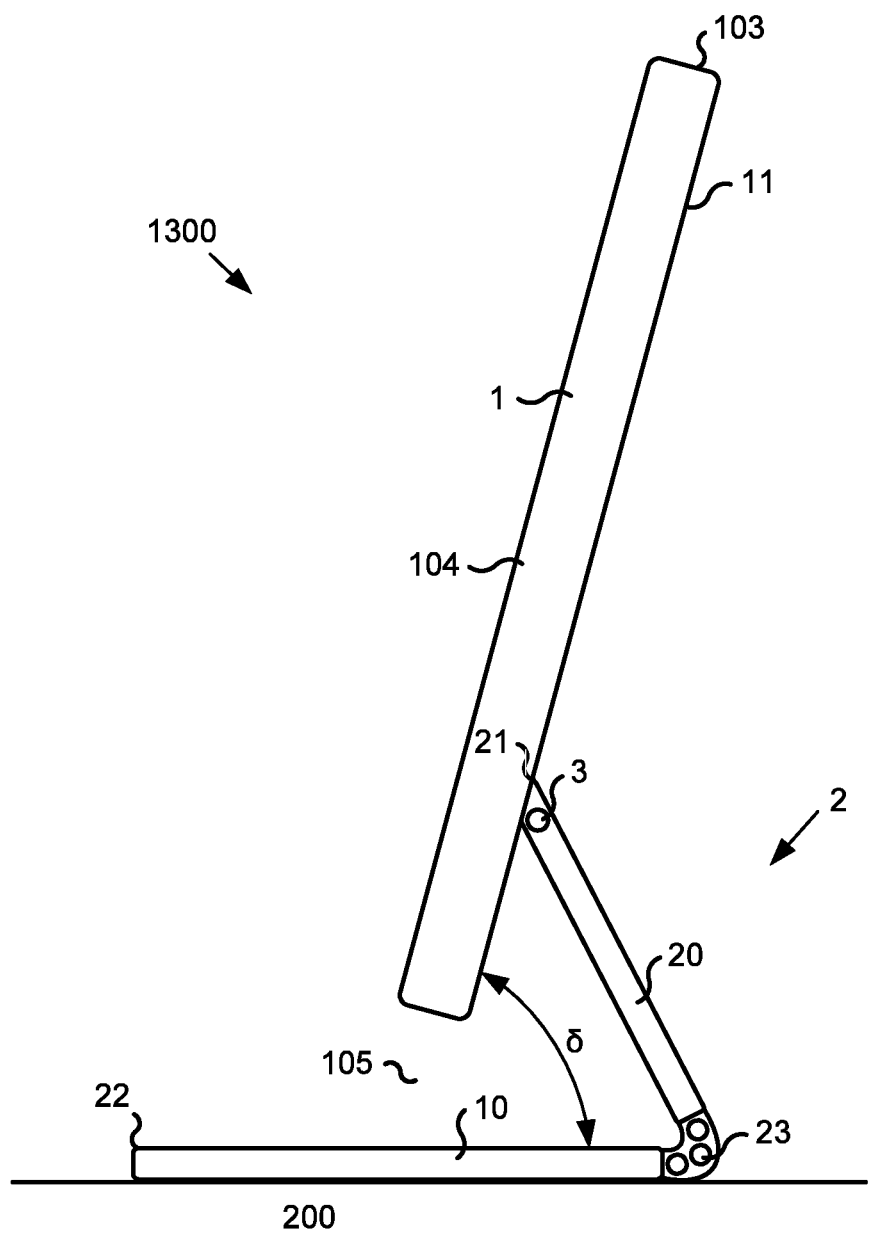
FIG. 14 is a side view illustrating one embodiment of an electronic device.

FIG. 14 depicts one embodiment of the electronic device 1300 in the seventh state. As illustrated in FIG. 14, the fourth included angle between the second edge 104 and the bearing surface 200 supporting the tablet personal computer may be less than the third included angle δ between the first edge 103 and the bearing surface 200. In one embodiment, the second edge 104 may be substantially parallel to the bearing surface 200. In one embodiment, the third included angle δ between the first edge 103 and the bearing surface 200 may include an angle from 90 degrees to 110 degrees. As illustrated in FIG. 13, the tablet may rotate towards the direction indicated by the arrow C. The second deformable structure 3 may act as a rotation axis to the location as illustrated in FIG. 14.

In some embodiments, the above-described support structure may support the tablet on the bearing surface 200 in the first to third support forms. The support structure may be in contact with the bearing surface 200. In response to the support structure being in different support forms, the contact area between the support structure and the bearing surface 200 may be different. In one embodiment, in response to the support structure including one form of the first to third support forms, the contact form between the support structure and the bearing surface 200 may also be different. For example, the contact may include line contact, point contact, surface contact, or the like.

In response to the support structure being in the first support form or the second support form, the second end 22 of the support structure and the lateral sides of the tablet may be in contact with the bearing surface 200 and may collaboratively provide support for the tablet. In one embodiment, the appearance and shape of the second end 22 may determine the contact manner between the support structure and the bearing surface 200.

Figure 15:
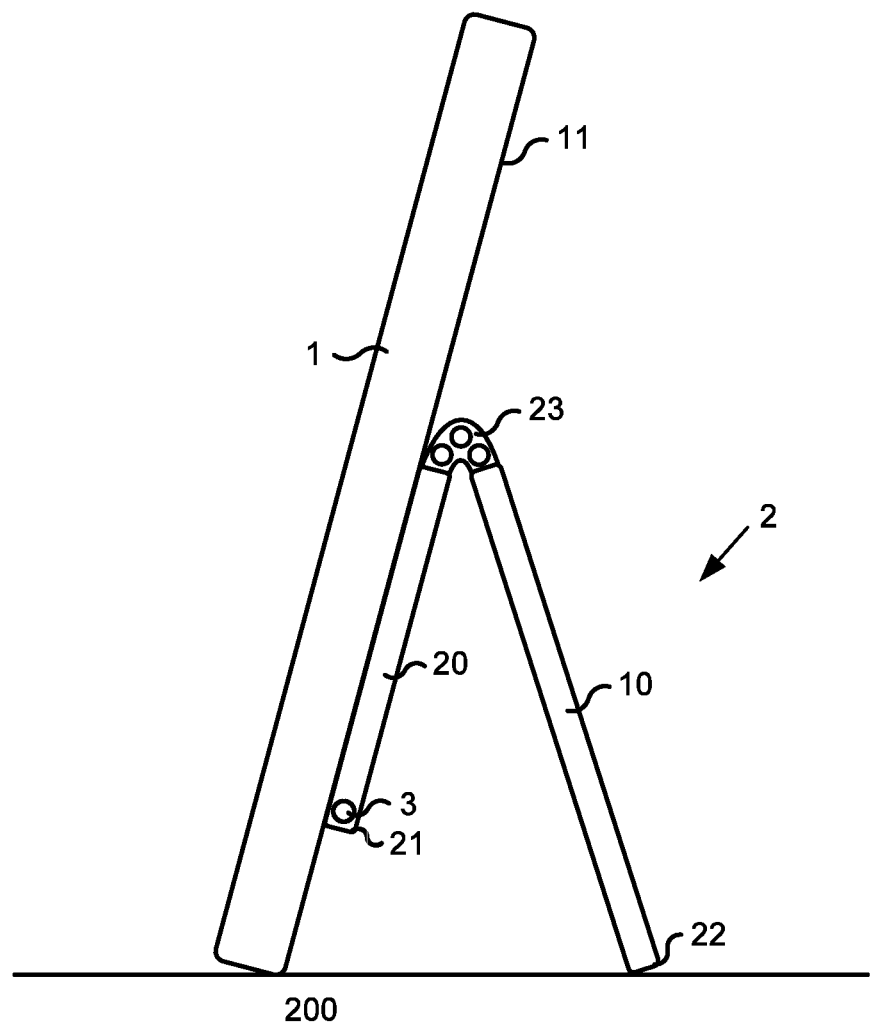
FIG. 15 is a side view illustrating one embodiment of an electronic device.

FIG. 15 depicts one embodiment of line contact between the support structure and the bearing surface 200. As illustrated in FIG. 15, the support structure may be in the second state. A profile of the second end 22 of the support structure may include a sharp corner shape. The second end 22 may include a specific width. In some embodiments, the support structure may be in line contact with the bearing surface 200. In one embodiment, in response to the profile of the second end including an arc shape and the second end 22 including a specific width, the support structure be in line contact with the bearing surface 200.

Figure 16:
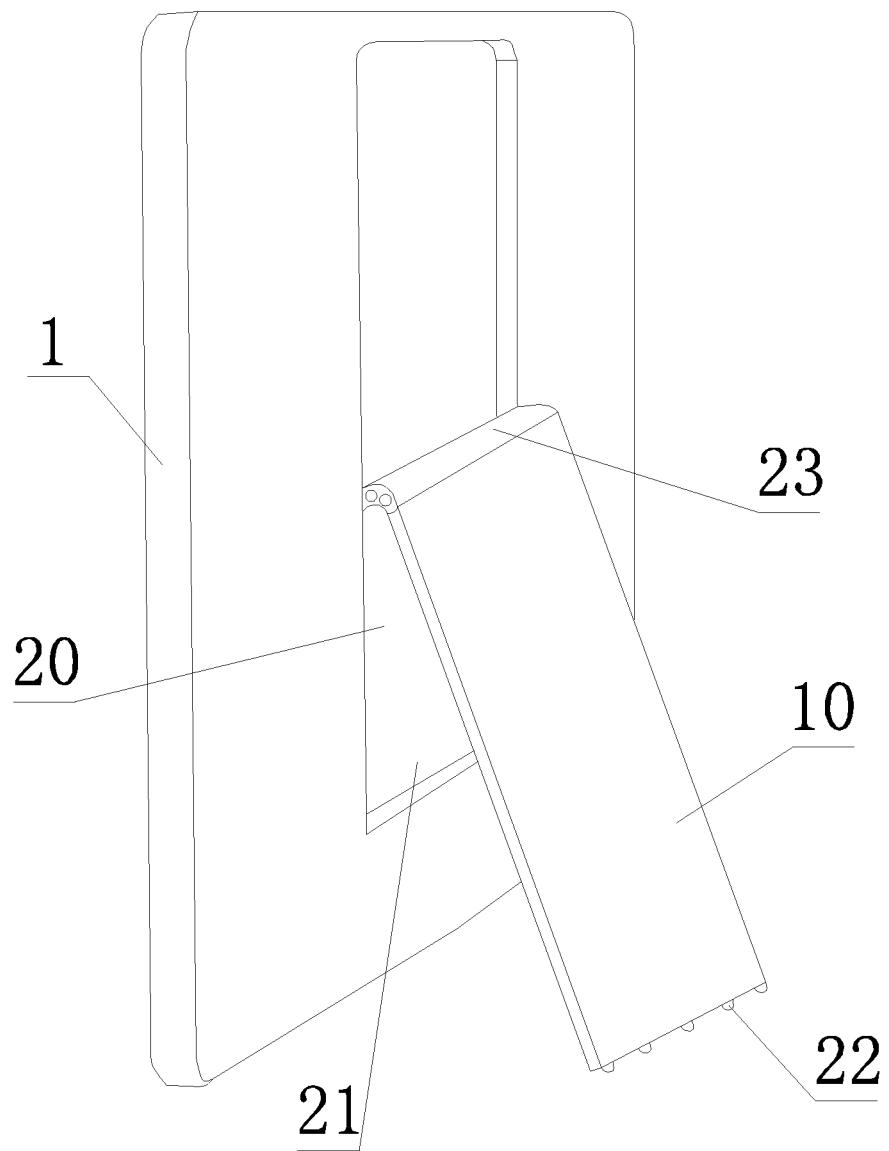
FIG. 16 is a perspective view illustrating one embodiment of an electronic device.

FIG. 16 depicts one embodiment of point contact between the support structure and the bearing surface 200. As illustrated in FIG. 16, the support structure may be in the second state. The second end 22 of the support structure may include a convex point. In one embodiment, the support structure may be in point contact with the bearing surface 200. In one embodiment, as depicted in FIG. 16, the second end 22 may include a gripping structure that may help the second end 22 grip to the surface it rests upon (for example, the bearing surface 200). In one embodiment the gripping structure may include the convex point, one or more convex points, or the like. The gripping structure, in some embodiments, may include a non-slip material.

Returning to FIG. 4, FIG. 4 depicts one embodiment of surface contact between the support structure and the bearing surface 200. As illustrated in FIG. 4, the support structure may include the first support form. The second end 22 of the support structure may include a flat surface. In one embodiment, the support structure is in surface contact with the bearing surface 200. In response to the support structure including the third support form, a side end 1001 of the first support member 10 may be in contact with the bearing surface 200. The side end 1001 may provide support for the tablet. In some embodiments, the tablet may be in suspension contact with the bearing surface 200. In the third support form, the appearance and shape of the side end 1001 of the first support member 10 may determine the specific contact manner between the support structure and the bearing surface 200.

Figure 17:
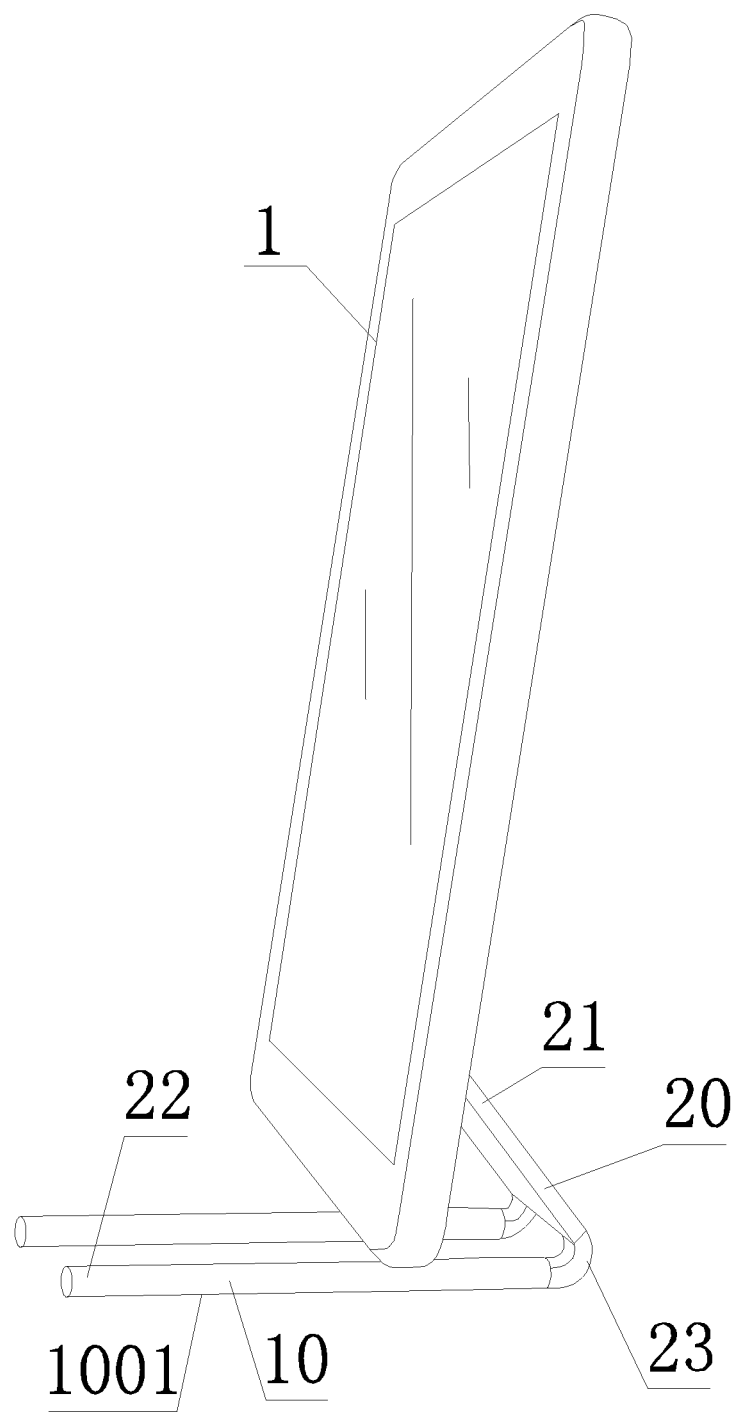
FIG. 17 is a perspective view illustrating one embodiment of an electronic device.

FIG. 17 depicts one embodiment of line contact between the support structure and the bearing surface 200. As illustrated in FIG. 17, the support structure may be in the seventh state. The first support member 10 may include a circular rod, and the support structure may be in line contact with the bearing surface 200. The first support member 10 may include one or more first support members 10. The one or more first support members 10 may branch out of the second support member 20 to form a fork shape. The one or more first support members 10 may be include a non-slip material. For example, as depicted in FIG. 17, the one or more support members 10 may be coated with a non-slip material.

Figure 18:
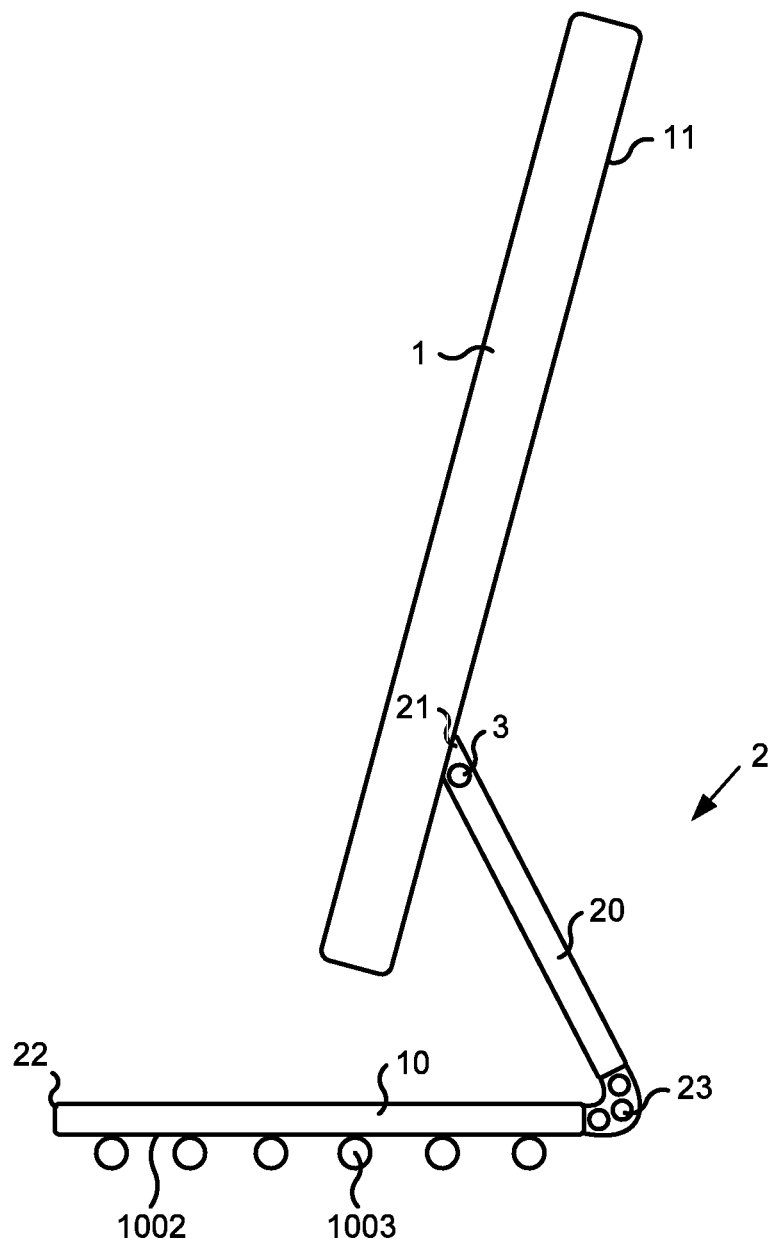
FIG. 18 is a side view illustrating one embodiment of an electronic device.

FIG. 18 depicts one embodiment of point contact between the support structure and the bearing surface 200. As illustrated in FIG. 18, the support structure may be in the seventh state. The side end 1001 of the first support member 10 may include a side surface 1002 and one or more convex points 1003 arranged on the side surface. The first support member 10 may contact the bearing surface 200 via the one or more convex points 1003. In one embodiment, the side end 1001 of the first support member 10 may be in point contact with the bearing surface 200, and correspondingly, the support structure may be in point contact with the bearing surface 200. In one embodiment, the one or more convex points 1003 may include one or more components that help the second body 2 grip the surface it rests upon (for example, the bearing surface 200). The convex points 1003 may include a material that grips the second body 2 to the surface. In one embodiment, the one or more convex points 1003 may deform to allow the second body to grip to a surface that may not be a substantially flat surface.

Returning to FIG. 13, FIG. 13 depicts one embodiment of surface contact between the support structure and the bearing surface 200. As illustrated in FIG. 13, the support structure may include the third support form. The first support member 10 may include a flat plate. In this case, the side end 1001 of the first support member 10 may be in surface contact with the bearing surface 200, and correspondingly, the support structure may be in surface contact with the bearing surface 200.

In some embodiments, the appearances and shapes of the second end of the support structure and the side end 1001 of the first support member 10 may determine the specific contact manners between the support structure and the bearing surface 200 in the first to third support forms. Regardless of the specific contact manner (line contact, point contact, surface contact, or the like) between the support structure and the bearing surface 200 in the first to third support forms, the contact areas between the support structure and the bearing surface 200 in the first to third support forms may be equal or different. The specific configurations may be determined according to the preferences of the user.

It should be noted herein that the terms "lateral side" and "edge" may both refer to the side surface of the tablet.

In some embodiments, a method may include the functionality or the like of the electronic device 100, 600, 800, 900, or 1300. In some embodiments, an apparatus may include one or more components of the electronic device 100, 600, 800, 900, or 1300. For example, in one embodiment, the apparatus may include the second body 2.

Described above are merely some embodiments of the present disclosure, and are not limitations of the present application. Various modifications, equivalent variations and modifications made to the above embodiments without departing from the technical essence of the present disclosure fall within the scope defined by the present disclosure.

What is claimed is:

1. An electronic device comprising:
a first body; and
a second body comprising
  a first end,
  a second end, and
  a first deformable structure disposed between the first end and the second end, wherein the first deformable structure comprises a plurality of deformable structures sequentially disposed at intervals between the first end and the second end of the second body, wherein proximate deformable structures in the plurality of deformable structures are separated by respective portions of the second body at common intervals along a length of the second body, and the respective portions of the second body rotate about an axis at the respective deformable structures,
  wherein the first end is disposed on a first side of the first body, and the second body forms a support structure that supports the first body in relation to a surface, wherein the second end is configured to contact the surface.

2. The electronic device of claim 1, wherein:
in response to the electronic device being in a first state, the first end and the second end of the second body are disposed against the first side of the first body; and
in response to the electronic device being in a second state, the first deformable structure deforms and the second end of the second body extends away from the first side of the first body.

3. The electronic device of claim 1, further comprising a second deformable structure disposed on the first end of the second body, wherein the second deformable structure connects the first end to the first side of the first body.

4. The electronic device of claim 3, wherein at least one of the first deformable structure and the second deformable structure consisting of at least one of:
  a rotatable hinge rotary shaft; and
  a multi-directional deformable structure comprising a flexible material and deformable along at least two directions.

5. The electronic device of claim 3, wherein the second deformable structure comprises a rotating shaft, and in response to the electronic device being in a third state, the second deformable structure rotates the second body away from the first side of the first body.

6. The electronic device of claim 5, wherein:
the first body comprises a first lateral side and a second lateral side that are disposed on opposite sides the first body, wherein the first lateral side and the second lateral side are disposed adjacent to the first side of the first body;
in response to the electronic device being in the third state, a first spacing between the first lateral side and a surface supporting the first body is less than a second spacing between the second lateral side and the surface supporting the first body; and
in response to the electronic device being in a fourth state, the second spacing is less than the first spacing.

7. The electronic device of claim 5, wherein:
the first body comprises a first edge, and a second edge adjacent to the first edge;
in response to the electronic device being in a fifth state, a first included angle between the first edge and a surface supporting the first body is less than a second included angle between the second edge and the surface supporting the first body; and
in response to the electronic device being in a sixth state, the second included angle is less than the first included angle.

8. The electronic device of claim 7, wherein in response to the electronic device being in a seventh state, the second body suspends the first body above a surface and forms a spacing region between the first body and the surface.

9. The electronic device of claim 1, wherein the first side of the first body comprises a receiving groove that receives the second body.

10. The electronic device of claim 1, wherein the first body comprises a portable computing device.

11. A method comprising:
providing a first body;
providing a second body, wherein the second body comprises a first end, a second end, and a first deformable structure;
disposing the first deformable structure between the first end and the second end, wherein the first deformable structure comprises a plurality of deformable structures sequentially disposed at intervals between the first end and the second end of the second body, wherein proximate deformable structures in the plurality of deformable structures are separated by respective portions of the second body at common intervals along a length of the second body, and the respective portions of the second body rotate about an axis at the respective deformable structures; and
disposing the first end on a first side of the first body, wherein the second body forms a support structure that supports the first body in relation to a surface, wherein the second end is configured to contact the surface.

12. The method of claim 11, further comprising:
disposing a second deformable structure on the first end of the second body; and
connecting the second deformable structure to the first side of the first body.

13. The method of claim 12, wherein the second deformable structure comprises a rotating shaft, and the method further comprises:

in response to the first and second bodies being connected to one another in a first half of the first side closest to a surface supporting the first body, rotating, through the second deformable structure, the first end of the second body away from the first side of the first body, and forming a first spacing between a first lateral side of the first body and a surface supporting the second body, wherein the first spacing is less than a second spacing between a second lateral side of the first body and the surface, and wherein the first lateral side and the second lateral side are disposed on opposite sides of an end face of the first side of the first body; and in response to the first and second bodies being connected to one another in a second half of the first side farthest from the surface supporting the first body, forming the second spacing less than the first spacing.

14. An apparatus comprising:

a first support structure end;

a second support structure end;

a first deformable structure disposed between the first support structure end and the second support structure end, wherein the first deformable structure comprises a plurality of deformable structures sequentially disposed at intervals between the first support structure end and the second support structure end of the apparatus, wherein proximate deformable structures in the plurality of deformable structures are separated by respective portions of the apparatus at common intervals along a length of the apparatus, and the respective portions of the apparatus rotate about an axis at the respective deformable structures; and a second deformable structure that connects to a first side of a computing device, wherein the apparatus supports the computing device in relation to a surface, wherein the second support structure end is configured to contact the surface.

15. The apparatus of claim 14, wherein:

in response to the computing device and the apparatus being in a first state, the second deformable structure attaches to the first side of the computing device; and in response to the computing device and the apparatus being in a second state, the second support structure end extends away from the first side of the computing device.

16. The apparatus of claim 14, wherein at least one of the first deformable structure and the second deformable structure consisting of at least one of:

a rotatable hinge rotary shaft; and a multi-directional deformable structure comprising a flexible material and deformable along at least two directions.

17. The apparatus of claim 14, wherein:

in response to the computing device and the apparatus being connected to one another in a half of the first side closest to a surface supporting the computing device, the second deformable structure rotates the first support structure end away from the first side of the computing device;

in response to the apparatus extending between the computing device and the surface supporting the computing device, the first support structure end and the second support structure end suspends the computing device above a surface that supports the apparatus, and form a spacing region between the computing device and the surface.

* * * * *